(12) United States Patent
Winkler et al.

(10) Patent No.: US 8,858,834 B2
(45) Date of Patent: Oct. 14, 2014

(54) CO-DOPED 1-1-2 NITRIDES

(75) Inventors: Holger Winkler, Darmstadt (DE); Ralf Petry, Griesheim (DE); Thomas Vosgroene, Ober-Ramstadt (DE); Thomas Juestel, Witten (DE); Arturas Kastelnikovas, Steinfurt (DE); Dominik Uhlich, Steinfurt (DE)

(73) Assignee: MERCK PATENT GmbH, Darmstadt (DE)

( * ) Notice: Subject to any disclaimer, the term of this patent is extended or adjusted under 35 U.S.C. 154(b) by 551 days.

(21) Appl. No.: 13/130,367

(22) PCT Filed: Nov. 2, 2009

(86) PCT No.: PCT/EP2009/007826
§ 371 (c)(1),
(2), (4) Date: May 20, 2011

(87) PCT Pub. No.: WO2010/057572
PCT Pub. Date: May 27, 2010

(65) Prior Publication Data
US 2011/0227475 A1 Sep. 22, 2011

(30) Foreign Application Priority Data

Nov. 22, 2008 (DE) .......................... 10 2008 058 621

(51) Int. Cl.
| | | |
|---|---|---|
| C09K 11/08 | (2006.01) | |
| C09K 11/66 | (2006.01) | |
| H01J 1/62 | (2006.01) | |
| H01J 63/04 | (2006.01) | |
| C09K 11/77 | (2006.01) | |
| C04B 35/584 | (2006.01) | |
| H01L 33/50 | (2010.01) | |

(52) U.S. Cl.
CPC ..... *C09K 11/7768* (2013.01); *C04B 2235/3275* (2013.01); *C04B 2235/3206* (2013.01); *C04B 2235/3279* (2013.01); *C04B 2235/401* (2013.01); *C04B 2235/445* (2013.01); *C04B 2235/3873* (2013.01); *C04B 2235/3205* (2013.01); *C04B 2235/3289* (2013.01); *C04B 2235/32* (2013.01); *C04B 2235/3262* (2013.01); *C04B 2235/465* (2013.01); *C04B 2235/3244* (2013.01); *C04B 35/584* (2013.01); *C04B 2235/3224* (2013.01); *C09K 11/7786* (2013.01); *H01L 33/502* (2013.01)
USPC ................................. 252/301.4 F; 313/503

(58) Field of Classification Search
CPC ........... C09K 11/7734; C09K 11/7792; C09K 11/87; C09K 11/676
USPC ............................. 252/301.4 F; 313/486, 503
See application file for complete search history.

(56) References Cited

U.S. PATENT DOCUMENTS

| 7,537,710 B2 | 5/2009 | Oshio |
| 8,088,304 B2 | 1/2012 | Winkler |

(Continued)

FOREIGN PATENT DOCUMENTS

| DE | 10 2007 010 719 | 9/2008 |
| EP | 2 009 078 A1 | 12/2008 |

(Continued)

OTHER PUBLICATIONS

International Search Report of PCT/EP2009/007826 (May 26, 2010).

(Continued)

*Primary Examiner* — Matthew E Hoban
(74) *Attorney, Agent, or Firm* — Millen, White, Zelano & Branigan, P.C.

(57) ABSTRACT

The invention relates to compounds of the formula (I): $(Ca,Sr,Ba)_{1-x-y}Me_ySiN_2:Eu_x$, where $Me=Mn^{2+}$, $Mg^{2+}$, $Be^{2+}$, $Ni^{2+}$, $Co^{2+}$ and/or $Ru^{2+}$; $x=0.005$ to $0.20$; and $y<1$, and/or of the formula (II): $(Ca,Sr,Ba)_{2-x}Si_{1-z}Ma_zN_2:Eu_x$, where $Ma=Hf^{4+}$, $Th^{4+}$ and/or $Zr^{4+}$; $x=0.005$ to $0.20$; and $z<1$, and to a process for the preparation of these compounds, and to the use as phosphors and conversion phosphors for conversion of the blue or near-UV emission from an LED.

30 Claims, 7 Drawing Sheets

(56) References Cited

U.S. PATENT DOCUMENTS

2007/0040152 A1* 2/2007 Oshio ............... 252/301.16
2009/0200515 A1 8/2009 Oshio
2010/0187976 A1 7/2010 Winkler

FOREIGN PATENT DOCUMENTS

| JP | 2007-511452 A | 5/2007 |
| JP | 2010-500704 A | 1/2010 |
| WO | WO 2005/049763 A1 | 6/2005 |
| WO | WO 2005/103199 A1 | 11/2005 |
| WO | WO 2009/003988 A1 | 1/2009 |

OTHER PUBLICATIONS

C.J. Duan et al., "Preparation, Electronic Structure, and Photoluminescence Properties of Eu2 and Ce3/Li Activated Alkaline Earth Silicon Nitride MSiN2 (M=Sr, Ba)", Chemistry of Materials, vol. 20 (2008) pp. 1597-1605.

S.S. Lee et al., "P-27 Photoluminescence and Electroluminescence in $Mg_xZn_{1-x}$ SIN2 Phosphors Doped with Eu and Tb", 1997 SID International Symposium Digest of Technical Papers, vol. 28 (May 13, 1997) pp. 576-579.

R. Le Toquin et al., "Red-Emitting Cerium-Based Phosphor Materials for Solid-State Lighting Applications", Chemical Physics Letters, vol. 423 (2006) pp. 352-356.

English Abstract of German Publication No. DE 10 2007 010 719. Date Published: Sep. 11, 2008. Applicant: Merck Patent GmbH. Inventor: Holger Winkler et al. "Luminophores made of Doped Garnets for PCLEDS". Application No. 10 2007 010 719.8. Filing Date: Mar. 6, 2007. (Questel).

* cited by examiner

CO-DOPED 1-1-2 NITRIDES

The invention relates to compounds which consist of 1-1-2 alkaline-earth metal siliconitrides co-doped with $Mn^{2+}$, $Mg^{2+}$, $Be^{2+}$, $Ni^{2+}$, $Co^{2+}$, $Ru^{4+}$, $Hf^{4+}$, $Th^{4+}$, to the preparation thereof, and to the use thereof as phosphors and LED conversion phosphors for warm-white LEDs or so-called colour-on-demand applications.

The colour-on-demand concept is taken to mean the achievement of light having a certain colour point by means of a pcLED (=phosphor converted LED) using one or more phosphors. This concept is used, for example, in order to produce certain corporate designs, for example for illuminated company logos, trademarks, etc.

Phosphor-converted LEDs represent an important light technology whose innovation potential is resulting in the increasing substitution of traditional artificial light sources (incandescent lamps, discharge lamps, etc.). Whereas semiconductor technology is virtually exhausted for LEDs, the phosphors employed offer room for improvement. LED manufacturers are repeatedly emphasising the necessity for red phosphors for (power) LEDs. The requisite properties of red phosphors for efficient and effective use in LEDs are, inter alia:

Emission bands in a wavelength range from 610-620 nm (general lighting with high CRI or high CCT), or 630 nm and 650 nm (display applications).

High fluorescence quenching temperatures ($TQ_{50} \gg 150°$ C.).

High chemical stability to acids and moisture.

High luminance, which results from high absorption in the spectral region of the emission band of the excited LED, high emission light extraction from the phosphor to the environment and high conversion efficiency (QE).

There is a number of phosphor material systems which meet some, but not all, of the above-mentioned conditions required by the LED manufacturer. However, only the fulfilment of all conditions will greatly accelerate the replacement of traditional electric light sources by LEDs and result in a reduction in the electrical energy required worldwide for lighting. Commercially available phosphor materials, which fluoresce in the red and can in principle be combined with blue (or UV) LEDs, are, in particular:

a) Orthosilicates:

The materials have high luminance and efficiency, but the longest emission wavelength is at about 610 nm and temperature quenching is at $TQ_{50}=150°$. Since power LEDs can reach such high operating temperatures, orthosilicates are much more suitable for LEDs which are operated with current strengths less than 350 mA (source: M. Zachau, Präsentation Phosphor Global Summit 2006, Mar. 15, 2007).

b) Sulfides, Thiogallates and Sulfoselenides:

These phosphors are capable of emitting in the above-mentioned wavelength ranges. The greatest disadvantage of sulfur-containing materials is their instability to atmospheric oxygen and moisture. Both very easily enter the LED by diffusion through the silicone binder material to the phosphor and react therewith, during which it is degraded. In addition, only low degrees of doping are frequently possible, resulting in saturation phenomena at a high excitation density.

c) Nitrides:

Covalent nitrides can in principle be employed as matrix for phosphors since they have a large band gap, in which the ground state and typically a few to many excited states of the activator ions are localised. Due to the high covalency, nitrides have a large nephelxauletic effect, as a result of which the energy of the lowest crystal field component of the excited $4f5d$ configuration of rare-earth activators, for example $Eu^{2+}$, $Ce^{3+}$, is reduced.

This results in long-wavelength excitation and emission from nitride phosphors (see Krevel et al., J. Alloys Compd. 1998, 268, 272) Siliconitrides, in particular, exhibit a close relationship with oxosilicon compounds, since both systems are built up from $SiX_4$ tetrahedra (X=O, N). Owing to the higher degree of condensation, however, siliconitrides have higher chemical stability than oxosilicon compounds (see Xie et al., Sci. Tech. Adv. Mater. 2007, 8, 588)

In particular, siliconitrides are suitable for doping with activator ions, such as $Eu^{2+}$ and $Ce^{3+}$, in which at least one electron in the excited state is not screened by the action of the crystal field ($5s$ and $5d$). Such activators have spectroscopic properties which are highly dependent on the environment (symmetry, covalency, coordination, field strength, bond lengths, lattice site size). The high formal charge of nitrogen ($N^{3-}$) results, in contrast to the lower formal charge of oxygen ($O^{2-}$), in the above-mentioned activators experiencing greater crystal-field splitting of the $5d$ orbitals in siliconitrides and the energetic centre of the $5d$ orbitals being shifted to lower energy than is the case in analogous Si—O materials. The excitation and emission bands of the activator thus exhibit a spectral red shift. Furthermore, the more stable and more rigid lattice of the siliconitrides compared with that of the oxosilicon compounds results in the Stokes shift being reduced, as a result of which the thermal quenching only takes place at higher temperatures and the conversion efficiency is increased.

The first siliconitride phosphor system to be published was $CaSiN_2.Eu^{2+}$ (see Lim et a. SPIE Vol. 3241, 1997, Photoluminescence of $CaSiN_2$:Eu). This phosphor is suitable as converter in blue- and UV-emitting LEDs since it luminesces luminescence at about 630 nm on excitation in these wavelength ranges.

The object of the present invention is therefore to modify the above-mentioned 1-1-2 alkaline-earth metal siliconitrides in such a way that these compounds achieve even higher light efficiency.

Surprisingly, it has been found that the requirement for an economically important further increase in the conversion efficiency of the phosphor $CaSiN_2$:$Eu^{2+}$ can be satisfied if co-doping with di- or tetravalent cations is carried out. In the analogous phosphor systems $BaSiN_2$:Eu and $SrSiN_2$:Eu, a significant increase in luminescence was surprisingly likewise discovered by carrying out co-doping.

The present invention thus relates to compounds of the 1-1-2 alkaline-earth metal siliconitride type with europium doping which additionally comprise co-dopants from the series manganese, magnesium, beryllium, nickel, cobalt, ruthenium, hafnium, thorium and/or zirconium.

"1-1-2 alkaline-earth metal siliconitrides" (also known as "1-1-2 nitrides or "1-1-2 alkaline-earth metal nitridosilicates) are taken to mean compositions $M_1Si_1N_2$:$Eu^{2+}$, where M represents an alkaline-earth metal or a mixture of a plurality of alkaline-earth metals.

Preference is given to compounds of the formula I

where
Me=$Mn^{2+}$, $Mg^{2+}$, $Be^{2+}$, $Ni^{2+}$, $Co^{2+}$ and/or $Ru^{2+}$
x=0.005 to 0.20 and
y<1.

Preference is furthermore given in accordance with the invention to compounds of the formula II

where
Ma=$Hf^{4+}$, $Th^{4+}$ and/or $Zr^{4+}$
x=0.005 to 0.20 and
z<1.

It is preferred for the y value (which stands for the atom concentration of the co-dopants Me or Ma) to be 0.0005 to 0.2, more preferably 0.001 to 0.02.

It is furthermore preferred if x=0.05 to 0.15.

The greater luminance of the compounds or phosphors of the formulae I to II according to the invention compared with those of identical composition, but without the co-dopants Mn, Mg, Be, Ni, Co and/or Ru, can be explained by means of theories known to the person skilled in the art by these ions having an influence on the lifetime of the excited states of the activator ions: excited electrons of such phosphors return to the ground state after a relatively short time with emission of fluorescence light, i.e. these electrons can carry out more excitation and relaxatation processes in the same time interval (see S. Shionoya, W. M. Yen, Phosphor Handbook, CRC Press, New York, 1999, ISBN 0-8493-7560-6).

The particle size of the compounds according to the invention is between 50 nm and 30 µm, preferably between 1 µm and 20 µm, more preferably between 2 and 15 µm.

Furthermore, monovalent ions, such as alkali or alkaline-earth metals, for example Li, Na, K, Ca, Sr, Ba, and halides, such as F or Cl, may additionally be incorporated into the crystal lattice of the compounds according to the invention. These monovalent ions are preferably employed as fluxing agents during phosphor preparation and serve for increasing the crystal quality, roughly setting the particle size and the particle morphology and thus have high potential for increasing the efficiency of the phosphors. This procedure is known to the person skilled in the art (see, for example, H. S. Kang et al. Mater. Science and Engineering B 121 (2005) 81-85).

The present invention furthermore relates to a compound obtainable by mixing silicon nitride-, europium- and calcium- and/or strontium- and/or barium-containing starting materials with at least one manganese-, magnesium-, beryllium-, nickel-, cobalt-, ruthenium-, hafnium-, thorium- and/or zirconium-containing co-dopant by solid-state diffusion methods with subsequent thermal aftertreatment, where a fluxing agent from the series of the alkali or alkaline-earth metal halides or also a borate compound may optionally be present.

The present invention furthermore relates to a process for the preparation of a compound of the 1-1-2 alkaline-earth metal siliconitride type with europium doping having the following process steps:
a) preparation of an Eu-doped 1-1-2 alkaline-earth metal siliconitride compound which is co-doped with manganese-, magnesium-, beryllium-, nickel-, cobalt- ruthenium-, hafnium- thorium- and/or zirconium-containing materials, by mixing at least 4 starting materials selected from silicon nitride-, europium-, calcium-, strontium-, barium-, manganese-, magnesium-, beryllium-, nickel-, cobalt-, ruthenium, hafnium, thorium- and/or zirconium-containing materials,
b) thermal aftertreatment of the compound co-doped with Mn, Mg, Be, Ni, Co, Ru, Hf, Th and/or Zr.

The starting materials for the preparation of the compound consist, as mentioned above, of silicon nitride ($Si_3N_4$), calcium hydride and europium fluoride and at least one Mn-, Mg-, Be-, Ni-, Co-, Ru-, Hf- and/or Zr-containing co-dopant. Besides the preferred nitrides, hydrides and fluorides, suitable starting materials are also further inorganic and/or organic substances, such as cyanamides, dicyanamides, cyanides, oxalates, malonates, fumarates, carbonates, citrates, ascorbates and acetylacetonates.

The thermal aftertreatment mentioned above (see process step b) takes a number of hours under reducing conditions, for example with forming gas (for example 90/10), pure hydrogen and/or in an ammonia atmosphere with or without the atmospheres mentioned above. The temperatures during the calcination process are between 1000° C. and 1800° C., preferably from 1200° C. to 1650° C.

With the aid of the processes mentioned above, it is possible to produce any desired outer shapes of the compounds or phosphors according to the invention, such as spherical particles, flakes and structured materials and ceramics. These shapes are summarised in accordance with the invention under the term "shaped body". The shaped body is preferably a "phosphor element".

The present invention thus furthermore relates to a shaped body comprising the compounds according to the invention, which has a rough surface which nanoparticles comprising $SiO_2$, $TiO_2$, $Al_2O_3$, ZnO, $ZrO_2$ and/or $Y_2O_3$ or mixed oxides thereof and/or particles comprising the compound according to the invention with or without dopants from the series europium, manganese, magnesium, beryllium, nickel, cobalt, ruthenium, hafnium, thorium and/or zirconium.

In a further preferred embodiment, the shaped body has a structured (for example pyramidal) surface on the side opposite an LED chip (see WO 2008/058619, Merck, which is incorporated in its full scope into the context of the present application by way of reference). This enables as much light as possible to be coupled out of the phosphor.

The structured surface on the shaped body is produced by subsequent coating with a suitable material, which is already structured, or in a subsequent step by (photo)lithographic processes, etching processes or by writing processes using energy beams or material jets or the action of mechanical forces.

In a further preferred embodiment, the shaped bodies according to the invention have, on the side opposite an LED chip, a rough surface which carries nanoparticles comprising $SiO_2$, $TiO_2$, $Al_2O_3$, $ZnO_2$, $ZrO_2$ and/or $Y_2O_3$, or combinations of these materials, and/or particles having the phosphor composition of the formula I and II with or without dopants from the series Mn, Mg, Be, Ni, Co and/or Ru. A rough surface here has a roughness of up to a few 100 nm. The coated surface has the advantage that total reflection can be reduced or prevented and the light can be coupled out of the phosphor according to the invention better (see WO 2008/058619 (Merck), which is incorporated in its full scope into the context of the present application by way of reference).

It is furthermore preferred for the shaped bodies according to the invention to have, on the surface facing away from the chip, a layer of matched refractive index which simplifies coupling out of the primary radiation and/or of the radiation emitted by the phosphor element.

In a further preferred embodiment, the shaped bodies have a continuous surface coating which consists of $SiO_2$, $TiO_2$, $Al_2O_3$, ZnO, $ZrO_2$ and/or $Y_2O_3$ or mixed oxides and/or of the compounds of the formula I or II without the activator europium. This surface coating has the advantage that a suitable graduation of the refractive index of the coating materials enables the refractive index to be matched to the environment. In this case, the scattering of the light at the surface of the phosphor is reduced and a greater proportion of the light can penetrate into the phosphor and be absorbed and converted there. In addition, the surface coating of matched refractive index enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed sheath is thermal decoupling of the actual phosphor from the heat arising in the chip. This heat results in a reduction in the fluorescence light yield of the phosphor and may also influence the colour of the fluorescence light. Finally, a coating of this type makes it possible to increase the efficiency of the phosphor by preventing lattice vibrations arising in the phosphor from propagating into the environment.

In addition, it is preferred for the shaped body to have a porous surface coating which consists of $SiO_2$, $TiO_2$, $Al_2O_3$, ZnO, $ZrO_2$ and/or $Y_2O_3$ or mixed oxides thereof and/or of the compounds of the formula I or II with or without dopants from the series Eu, Mn, Mg, Be, Ni, Co, Ru, Hf, Th and/or Zr. These porous coatings offer the possibility of further reducing the refractive index of a single layer. Porous coatings of this type can be produced by three conventional methods, as described in WO 03/027015, which is incorporated in its full scope into the context of the present application by way of reference: etching of glass (for example soda-lime glasses (see U.S. Pat. No. 4,019,884)), application of a porous layer, and combination of a porous layer and an etching process.

In a further preferred embodiment, the shaped body has a surface which carries functional groups which facilitate chemical or physical bonding to the environment, preferably consisting of epoxy or silicone resin. These functional groups can be esters or other derivatives bonded, for example, via oxo groups which are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thus be adjusted to a certain extent. Processing of the mixtures is thus simplified. Physical bonding to the environment in this connection is taken to mean electrostatic interactions between the systems via charge fluctuations or partial charges.

Since the phosphor layer according to the invention applied to the LED chip preferably consists of a mixture of silicone and homogeneous phosphor particles, and the silicone has a surface tension, this phosphor layer is non-uniform at a microscopic level or the thickness of the layer is not constant throughout.

As a further preferred embodiment, flake-form phosphors are prepared by conventional processes from the corresponding metal and/or rare-earth salts. The preparation process is described in detail in EP 763573 and WO 2008/058620, which are incorporated in their full scope into the context of the present application by way of reference. These flake-form phosphors can be prepared by coating a natural or synthetically produced, highly stable support or a substrate of, for example, mica flakes, $SiO_2$ flakes, $Al_2O_3$ flakes, $ZrO_2$ flakes, glass flakes or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from a material. If the flake itself serves merely as support for the phosphor coating, the latter must consist of a material which is transparent to the primary radiation from the LED, or absorbs the primary radiation and transmits this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 µm, preferably between 150 nm and 5 µm. The diameter here is from 50 nm to 20 µm.

They generally have an aspect ratio (ratio of the diameter to the particle thickness) from 1:1 to 400:1 and in particular 3:1 to 100:1.

The flake size (length×width) is dependent on the arrangement. Flakes are also suitable as centres of scattering within the conversion layer, in particular if they have particularly small dimensions.

The surface of the flake-form phosphor according to the invention facing the LED chip can be provided with a coating which has a reflection-reducing action in relation to the primary radiation emitted by the LED chip. This results in a reduction in back-scattering of the primary radiation, enhancing coupling of the latter into the phosphor element according to the invention. Suitable for this purpose are, for example, refractive-index-matched coatings, which must have a following thickness d: d=[wavelength of the primary radiation from the LED chip/(4*refractive index of the phosphor ceramic)], see, for example, Gerthsen, Physik [Physics], Springer Verlag, 18th Edition, 1995. This coating may also consist of photonic crystals, which also encompasses structuring of the surface of the flake-form phosphor in order to achieve certain functionalities.

The production of the shaped bodies according to the invention in the form of ceramic elements is carried out analogously to the process described in WO 2008/017353 (Merck), which is incorporated in its full scope into the context of the present application by way of reference. The phosphor here is prepared by mixing the corresponding starting materials and dopants, subsequently pressing the mixture isostatically and applying the mixture in the form of a homogeneous, thin and non-porous flake directly to the surface of the chip or at a distance from the chip (remote phosphor concept). The respective arrangement depends, inter alia, on the architecture of the LED device, the person skilled in the art being capable of selecting the advantageous arrangement. No location-dependent variation of the excitation of and emission from the phosphor thus takes place, causing the LED provided therewith to emit a homogeneous light cone of constant colour and to have high luminous power. The ceramic phosphor elements can be produced on a large industrial scale, for example, as flakes in thicknesses from a few 100 nm to about 500 µm. The flake size (length×width) is dependent on the arrangement. In the case of direct application to the chip, the size of the flake should be selected in accordance with the chip size (from about 100 µm*100 µm to several $mm^2$) with a certain excess size of about 10%-30% of the chip surface in the case of a suitable chip arrangement (for example flip-chip arrangement) or correspondingly. If the phosphor flake is installed on top of a finished LED, all of the emitted light cone will hit the flake.

The side surfaces of the ceramic phosphor element can be metallised with a light or noble metal, preferably aluminium or silver. The metallisation has the effect that light does not exit laterally from the phosphor element. Light exiting laterally can reduce the light flux to be coupled out of the LED. The metallisation of the ceramic phosphor element is carried out in a process step after isostatic pressing to give rods or flakes, where, if desired, the rods or flakes can be cut to the necessary size before the metallisation. To this end, the side surfaces are wetted, for example with a solution of silver nitrate and glucose, and subsequently exposed to an ammonia atmosphere at elevated temperature. During this operation, a silver coating, for example, forms on the side surfaces.

Alternatively, electroless metallisation processes are suitable, see, for example, Hollemann-Wiberg, Lehrbuch der anorganischen Chemie [Textbook of Inorganic Chemistry], Walter de Gruyter Verlag, or Ullmanns Enzyklopädie der chemischen Technologie [Ullmann's Encyclopaedia of Chemical Technology].

The ceramic phosphor element can, if necessary, be fixed to the substrate of an LED chip using a water-glass solution.

In a further embodiment, the ceramic phosphor element has a structured (for example pyramidal) surface on the side opposite an LED chip. This enables as much light as possible to be coupled out of the phosphor element. The structured surface on the phosphor element is produced by carrying out the isostatic pressing using a mould having a structured press plate and thus embossing a structure into the surface. Structured surfaces are desired if the aim is to produce the thinnest possible phosphor elements or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are ⅔ to ⅚ of the melting point of the substance to be pressed.

The present invention furthermore relates to a process for the production of a shaped body, preferably a phosphor element, having the following process steps:
a) preparation of a europium-doped 1-1-2 alkaline-earth metal siliconitride compound which is co-doped with manganese-, magnesium-, beryllium-, nickel-, cobalt-, ruthenium-, hafnium-, thorium- and/or zirconium-containing materials, by mixing at least 4 starting materials selected from silicon nitride-, europium-, calcium-, strontium-, barium-, manganese-, magnesium-, beryllium-, nickel-, cobalt-, ruthenium-, hafnium-, thorium- and/or zirconium-containing materials,
b) thermal aftertreatment of the compound co-doped with manganese, magnesium, beryllium, nickel, cobalt, ruthenium, hafnium, thorium and/or zirconium and formation of a shaped body having a rough surface,
c) coating of the rough surface with nanoparticles comprising $SiO_2$, $TIO_2$, $Al_2O_3$, ZnO, $ZrO_2$ and/or $Y_2O_3$ or mixed oxides thereof or with nanoparticles comprising the compounds according to the invention.

In addition, the phosphors according to the invention can be excited over a broad range, which extends from about 410 nm to 530 nm, preferably 430 nm to about 500 nm. These phosphors are thus not only suitable for excitation by UV or blue-emitting primary light sources, such as LEDs, or conventional discharge lamps (for example based on Hg), but also for light sources like those which utilise the blue $In^{3+}$ line at 451 nm.

The present invention furthermore relates to an illumination unit having at least one primary light source whose emission maximum or maxima is or are in the range 410 nm to 530 nm, preferably 430 nm to about 500 nm, particularly preferably 440 to 480 nm, where the primary radiation is partially or completely converted into longer-wavelength radiation by the compounds or phosphors according to the invention. This illumination unit preferably emits white light or emits light having a certain colour point (colour-on-demand principle). Preferred embodiments of the illumination units according to the invention are depicted in Figures 7 to 18.

In a preferred embodiment of the illumination unit according to the invention, the light source is a luminescent indium aluminium gallium nitride, in particular of the formula $In_i Ga_j Al_k N$, where $0 \le i$, $0 \le j$, $0 \le k$, and $i+j+k=1$. Possible forms of light sources of this type are known to the person skilled in the art. They can be light-emitting LED chips having various structures.

In a further preferred embodiment of the illumination unit according to the invention, the light source is a luminescent arrangement based on ZnO, TCO (transparent conducting oxide), ZnSe or SiC or an arrangement based on an organic light-emitting layer (OLED).

In a further preferred embodiment of the illumination unit according to the invention, the light source is a source which exhibits electroluminescence and/or photoluminescence. The light source may furthermore also be a plasma or discharge source.

The phosphors according to the invention can either be dispersed in a resin (for example epoxy or silicone resin) or, given suitable size ratios, arranged directly on the primary light source or, depending on the application, arranged remote therefrom (the latter arrangement also includes "remote phosphor technology"). The advantages of remote phosphor technology are known to the person skilled in the art and are revealed, for example, in the following publication: Japanese Journ. of Appl. Phys. Vol. 44, No. 21 (2005). L649-L651.

In a further embodiment, it is preferred for the optical coupling of the illumination unit between the phosphor and the primary light source to be achieved by means of a light-conducting arrangement. This enables the primary light source to be installed at a central location and to be optically coupled to the phosphor by means of light-conducting devices, such as, for example, light-conducting fibres. In this way, lamps matched to the illumination wishes and merely consisting of one or different phosphors, which may be arranged to form a light screen, and a light conductor, which is coupled to the primary light source, can be achieved. In this way, it is possible to position a strong primary light source at a location which is favourable for the electrical installation and to install lamps comprising phosphors which are coupled to the light conductors at any desired locations without further electrical cabling, but instead only by laying light conductors.

The present invention furthermore relates to the use of the compounds according to the invention as conversion phosphor for the partial or complete conversion of the blue or near-UV emission from a luminescent diode.

The compounds according to the invention are furthermore preferably used for conversion of the blue or near-UV emission into visible white radiation. The compounds according to the invention are furthermore preferably used for conversion of the primary radiation into a certain colour point in accordance with the "colour-on-demand" concept.

The compounds of the formula I and II according to the invention can be employed individually or as a mixture with the following phosphors which are familiar to the person skilled in the art:
$Ba_2SiO_4:Eu^{2+}$, $BaSi_2O_5:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8Er^{3+},Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+},Mn^{2+}$, $CaAl_2O_4:Tb^{3+}$, $Ca_3Al_2Si_3O_{12}:Ce^{3+}$, $Ca_3Al_2Si_3Oi_2:Ce^{3+}$, $Ca_3Al_2Si_3O_{,2}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+},Mn^{2+}$, $Ca_2Ba_3(PO4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+},Mn^{2+}$, $CaF_2:Ce^{3+}$, Tb$^{3+}$, CaF$_2$:Eu$^{2+}$, CaF$_2$:Mn$^{2+}$, CaF$_2$:U, CaGa$_2$O$_4$:Mn$^{2+}$, CaGa$_4$O$_7$:Mn$^{2+}$, CaGa$_2$S$_4$:Ce$^{3+}$, CaGa$_2$S$_4$:Eu$^{2+}$, CaGa$_2$S$_4$:Mn$^{2+}$, CaGa$_2$S$_4$:Pb$^{2+}$, CaGeO$_3$:Mn$^{2+}$, CaI$_2$:Eu$^{2+}$ in SiO$_2$, CaI$_2$:Eu$^{2+}$,Mn$^{2+}$ in SiO$_2$, CaLaBO$_4$:Eu$^{3+}$, CaLaB$_3$O$_7$:Ce$^{3+}$,Mn$^{2+}$, Ca$_2$La$_2$BO$_{6.5}$:Pb$^{2+}$, Ca$_2$MgSi$_2$O$_7$, Ca$_2$MgSi$_2$O$_7$:Ce$^{3+}$, CaMgSi$_2$O$_6$:Eu$^{2+}$, Ca$_3$MgSi$_2$O$_8$:Eu$^{2+}$, Ca$_2$MgSi$_2$O$_7$:Eu$^{2+}$, CaMgSi$_2$O$_6$:Eu$^{2+}$,Mn$^{2+}$, Ca$_2$MgSi$_2$O$_7$:Eu$^{2+}$,Mn$^{2+}$, CaMoO$_4$, CaMoO$_4$:Eu$^{3+}$, CaO:Bi$^{3+}$, CaO:Cd$^{2+}$, CaO:Cu$^+$, CaO:Eu$^{3+}$, CaO:Eu$^{3+}$, Na$^+$, CaO:Mn$^{2+}$, CaO:Pb$^{2+}$, CaO:Sb$^{3+}$, CaO:Sm$^{3+}$, CaO:Tb$^{3+}$, CaO:Tl, CaO:Zn$^{2+}$, Ca$_2$P$_2$O$_7$:Ce$^{3+}$, $\alpha$-Ca$_3$(PO$_4$)$_2$:Ce$^{3+}$, $\beta$-Ca$_3$(PO$_4$)$_2$:Ce$^{3+}$, Ca$_5$(PO$_4$)$_3$Cl:Eu$^{2+}$, Ca$_5$(PO$_4$)$_3$Cl:Mn$^{2+}$, Ca$_5$(PO$_4$)$_3$Cl:Sb$^{3+}$, Ca$_5$(PO$_4$)$_3$Cl:Sn$^{2+}$, $\beta$-Ca$_3$(PO$_4$)$_2$:Eu$^{2+}$,Mn$^{2+}$, Ca$_5$(PO$_4$)$_3$F:Mn$^{2+}$, Ca$_5$(PO$_4$)$_3$F:Sb$^{3+}$, Ca$_5$(PO$_4$)$_3$F:Sn$^{2+}$, $\alpha$-Ca$_3$(PO$_4$)$_2$:Eu$^{2+}$, $\beta$-Ca$_3$(PO$_4$)$_2$:Eu$^{2+}$, Ca$_2$P$_2$O$_7$:Eu$^{2+}$, Ca$_2$P$_2$O$_7$:Eu$^{2+}$,Mn$^{2+}$, CaP$_2$O$_6$:Mn$^{2+}$, $\alpha$-Ca$_3$(PO$_4$)$_2$:Pb$^{2+}$, $\alpha$-Ca$_3$(PO$_4$)$_2$:Sn$^{2+}$, $\beta$-Ca$_3$(PO$_4$)$_2$:Sn$^{2+}$, $\beta$-Ca$_2$P$_2$O$_7$:Sn,Mn, $\alpha$-Ca$_3$(PO$_4$)$_2$:Tr, CaS:Bi$^{3+}$, CaS:Bi$^{3+}$, Na, CaS:Ce$^{3+}$, CaS:Eu$^{2+}$, CaS:Cu$^+$,Na$^+$, CaS:La$^{3+}$, CaS:Mn$^{2+}$, CaSO$_4$:Bi, CaSO$_4$:Ce$^{3+}$, CaSO$_4$:Ce$^{3+}$,Mn$^{2+}$, CaSO$_4$:Eu$^{2+}$, CaSO$_4$:Eu$^{2+}$,Mn$^{2+}$, CaSO$_4$:Pb$^{2+}$, CaS:Pb$^{2+}$, CaS:Pb$^{2+}$,Cl, CaS:Pb$^{2+}$,Mn$^{2+}$, CaS:Pr$^{3+}$,Pb$^{2+}$,Cl, CaS:Sb$^{3+}$, CaS:Sb$^{3+}$,Na, CaS:Sm$^{3+}$, CaS:Sn$^{2+}$, CaS:Sn$^{2+}$,F, CaS:Tb$^{3+}$, CaS:Tb$^{3+}$,Cl, CaS:Y$^{3+}$, CaS:Yb$^{2+}$, CaS:Yb$^{2+}$,Cl, CaSiO$_3$:Ce$^{3+}$, Ca$_3$SiO$_4$Cl$_2$:Eu$^{2+}$, Ca$_3$SiO$_4$Cl$_2$:Pb$^{2+}$, CaSiO$_3$:Eu$^{2+}$, CaSiO$_3$:Mn$^{2+}$,Pb, CaSiO$_3$:Pb$^{2+}$, CaSiO$_3$:Pb$^{2+}$,Mn$^{2+}$, CaSiO$_3$:Ti$^{4+}$, CaSr$_2$(PO$_4$)$_2$:Bi$^{3+}$, $\beta$-(Ca,Sr)$_3$(PO$_4$)$_2$:Sn$^{2+}$Mn$^{2+}$, CaTi$_{0.9}$Al$_{0.1}$O$_3$:Bi$^{3+}$, CaTiO$_3$:Eu$^{3+}$, CaTiO$_3$Pr$^{3+}$, Ca$_5$(VO$_4$)$_3$Cl, CaWO$_4$, CaWO$_4$:Pb$^{2+}$, CaWO$_4$:W, Ca$_3$WO$_6$:U, CaYAlO$_4$:Eu$^{3+}$, CaYBO$_4$:Bi$^{3+}$, CaYBO$_4$:Eu$^{3+}$, CaYB$_{0.8}$O$_{3.7}$:Eu$^{3+}$, CaY$_2$ZrO$_6$:Eu$^{3+}$, (Ca,Zn,Mg)$_3$(PO$_4$)$_2$:Sn, CeF$_3$, (Ce,Mg)BaAl$_{11}$O$_{18}$:Ce, (Ce,Mg)SrAl$_{11}$O$_{18}$:Ce, CeMgAl$_{11}$O$_{19}$:Ce:Tb, Cd$_2$B$_6$O$_{11}$:Mn$^{2+}$, CdS:Ag$^+$,Cr, CdS:In, CdS:In, CdS:In,Te, CdS:Te, CdWO$_4$, CsF, CsI, CsI:Na$^+$, CsI:Tl, (ErCl$_3$)$_{0.25}$(BaCl$_2$)$_{0.75}$, GaN:Zn, Gd$_3$Ga$_5$O$_{12}$:Cr$^{3+}$, Gd$_3$Ga$_5$O$_{12}$:Cr,Ce, GdNbO$_4$:Bi$^{3+}$, Gd$_2$O$_2$S:Eu$^{3+}$, Gd$_2$O$_2$Pr$^{3+}$, Gd$_2$O$_2$S:Pr,Ce,F, Gd$_2$O$_2$S:Tb$^{3+}$, Gd$_2$SiO$_5$:Ce$^{3+}$, KAl$_{11}$O$_{17}$:Tl$^+$, KGa$_{11}$O$_{17}$:Mn$^{2+}$, K$_2$La$_2$Ti$_3$O$_{10}$:Eu, KMgF$_3$:Eu$^{2+}$, KMgF$_3$:Mn$^{2+}$, K$_2$SiF$_6$:Mn$^{4+}$, LaAl$_3$B$_4$O$_{12}$:Eu$^{3+}$, LaAlB$_2$O$_6$:Eu$^{3+}$, LaAlO$_3$:Eu$^{3+}$, LaAlO$_3$:Sm$^{3+}$, LaAsO$_4$:Eu$^{3+}$, LaBr$_3$:Ce$^{3+}$, LaBO$_3$:Eu$^{3+}$, (La,Ce,Tb)PO$_4$:Ce:Tb, LaCl$_3$:Ce$^{3+}$, La$_2$O$_3$:Bi$^{3+}$, LaOBr:Tb$^{3+}$, LaOBr:Tm$^{3+}$, LaOCl:Bi$^{3+}$, LaOCl:Eu$^{3+}$, LaOF:Eu$^{3+}$, La$_2$O$_3$:Eu$^{3+}$, La$_2$O$_3$:Pr$^{3+}$, La$_2$O$_2$S:Tb$^{3+}$, LaPO$_4$:Ce$^{3+}$, LaPO$_4$:Eu$^{3+}$, LaSiO$_3$Cl:Ce$^{3+}$, LaSiO$_3$Cl:Ce$^{3+}$,Tb$^{3+}$, LaVO$_4$:Eu$^{3+}$, La$_2$W$_3$O$_{12}$:Eu$^{3+}$, LiAlF$_4$:Mn$^{2+}$, LiAl$_5$O$_8$:Fe$^{3+}$, LiAlO$_2$:Fe$^{3+}$, LiAlO$_2$:Mn$^{2+}$, LiAl$_5$O$_8$:Mn$^{2+}$, Li$_2$CaP$_2$O$_7$:Ce$^{3+}$,Mn$^{2+}$, LiCeBa$_4$Si$_4$O$_{14}$:Mn$^{2+}$, LiCeSrBa$_3$Si$_4$O$_{14}$:Mn$^{2+}$, LiInO$_2$:Eu$^{3+}$, LiInO$_2$:Sm$^{3+}$, LiLaO$_2$:Eu$^{3+}$, LuAlO$_3$:Ce$^{3+}$, (Lu,Gd)$_2$SiO$_5$:Ce$^{3+}$, Lu$_2$SiO$_5$:Ce$^{3+}$, Lu$_2$Si$_2$O$_7$:Ce$^{3+}$, LuTaO$_4$:Nb$^{5+}$, Lu$_{1-x}$Y$_x$AlO$_3$:Ce$^{3+}$, MgAl$_2$O$_4$:Mn$^{2+}$, MgSrAl$_{10}$O$_{17}$:Ce, MgB$_2$O$_4$:Mn$^{2+}$, MgBa$_2$(PO$_4$)$_2$:Sn$^{2+}$, MgBa$_2$(PO$_4$)$_2$:U, MgBaP$_2$O$_7$:Eu$^{2+}$, MgBaP$_2$O$_7$:Eu$^{2+}$,Mn$^{2+}$, MgBa$_3$Si$_2$O$_8$:Eu$^{2+}$, MgBa(SO$_4$)$_2$:Eu$^{2+}$, Mg$_3$Ca$_3$(PO$_4$)$_4$:Eu$^{2+}$, MgCaP$_2$O$_7$:Mn$^{2+}$, Mg$_2$Ca(SO$_4$)$_3$:Eu$^{2+}$, Mg$_2$Ca(SO$_4$)$_3$:Eu$^{2+}$,Mn$^2$, MgCeAl$_n$O$_{19}$:Tb$^{3+}$, Mg$_4$(F)GeO$_6$:Mn$^{2+}$, Mg$_4$(F)(Ge,Sn)O$_6$:Mn$^{2+}$, MgF$_2$:Mn$^{2+}$, MgGa$_2$O$_4$:Mn$^{2+}$, Mg$_8$Ge$_2$O$_{11}$F$_2$:Mn$^{4+}$, MgS:Eu$^{2+}$, MgSiO$_3$:Mn$^{2+}$, Mg$_2$SiO$_4$:Mn$^{2+}$, Mg$_3$SiO$_3$F$_4$:Ti$^{4+}$, MgSO$_4$:Eu$^{2+}$, MgSO$_4$:Pb$^{2+}$, MgSrBa$_2$Si$_2$O$_7$:Eu$^{2+}$, MgSrP$_2$O$_7$:Eu$^{2+}$, MgSr$_5$(PO$_4$)$_4$:Sn$^{2+}$, MgSr$_3$Si$_2$O$_8$:Eu$^{2+}$,Mn$^{2+}$, Mg$_2$Sr(SO$_4$)$_3$:Eu$^{2+}$, Mg$_2$TiO$_4$:Mn$^{4+}$, MgWO$_4$, MgYBO$_4$:Eu$^{3+}$, Na$_3$Ce(PO$_4$)$_2$:Tb$^{3+}$, NaI:Tl, Na$_{1.23}$K$_{0.42}$Eu$_{0.12}$TiSi$_4$O$_{11}$:Eu$^{3+}$, Na$_{1.23}$K$_{0.42}$Eu$_{0.12}$TiSi$_5$O$_{13}$.xH$_2$O:Eu$^{3+}$, Na$_{1.29}$K$_{0.46}$Er$_{0.08}$TiSi$_4$O$_{11}$:Eu$^{3+}$, Na$_2$Mg$_3$Al$_2$Si$_2$O$_{10}$:Tb, Na(Mg$_{2-x}$Mn$_x$)LiSi$_4$O$_{10}$F$_2$:Mn, NaYF$_4$:Er$^{3+}$, Yb$^{3+}$, NaYO$_2$:Eu$^{3+}$, P46(70%)+P47 (30%), SrAl$_{12}$O$_{19}$:Ce$^{3+}$, Mn$^{2+}$, SrAl$_2$O$_4$:Eu$^{2+}$, SrAl$_4$O$_7$:Eu$^{3+}$, SrAl$_{12}$O$_{19}$:Eu$^{2+}$, SrAl$_2$S$_4$:Eu$^{2+}$, Sr$_2$B$_5$O$_9$Cl:Eu$^{2+}$, SrB$_4$O$_7$:Eu$^{2+}$(F,Cl,Br), SrB$_4$O$_7$:Pb$^{2+}$, SrB$_4$O$_7$:Pb$^{2+}$, Mn$^{2+}$, SrB$_8$O$_{13}$:Sm$^{2+}$, Sr$_x$Ba$_y$Cl$_z$Al$_2$O$_{4-z/2}$: Mn$^{2+}$, Ce$^{3+}$, SrBaSiO$_4$:Eu$^{2+}$, Sr(Cl,Br,I)$_2$:Eu$^{2+}$in SiO$_2$, SrCl$_2$:Eu$^{2+}$ in SiO$_2$, Sr$_5$Cl(PO$_4$)$_3$:Eu, Sr$_w$F$_x$B$_4$O$_{6.5}$:Eu$^{2+}$, Sr$_w$F$_x$B$_y$O$_z$:Eu$^{2+}$,Sm$^{2+}$, SrF$_2$:Eu$^{2+}$, SrGa$_{12}$O$_{19}$:Mn$^{2+}$, SrGa$_2$S$_4$:Ce$^{3+}$, SrGa$_2$S$_4$:Eu$^{2+}$, SrGa$_2$S$_4$:Pb$^{2+}$, SrIn$_2$O$_4$:Pr$^{3+}$, Al$^{3+}$, (Sr,Mg)$_3$(PO$_4$)$_2$:Sn, SrMgSi$_2$O$_6$:Eu$^{2+}$, Sr$_2$MgSi$_2$O$_7$:Eu$^{2+}$, Sr$_3$MgSi$_2$O$_8$:Eu$^{2+}$, SrMoO$_4$:U, SrO.3B$_2$O$_3$:Eu$^{2+}$,Cl, $\beta$-SrO.3B$_2$O$_3$:Pb$^{2+}$, $\beta$-SrO.3B$_2$O$_3$:Pb$^{2+}$,Mn$^{2+}$, $\beta$-SrO.3B$_2$O$_3$:Sm$^{2+}$, Sr$_6$P$_5$BO$_{20}$:Eu, Sr$_5$(PO$_4$)$_3$Cl:Eu$^{2+}$, Sr$_5$(PO$_4$)$_3$Cl:Eu$^{2+}$,Pr$^{3+}$, Sr$_5$(PO$_4$)$_3$Cl:Mn$^{2+}$, Sr$_5$(PO$_4$)$_3$Cl:Sb$^{3+}$, Sr$_2$P$_2$O$_7$:Eu$^{2+}$, $\beta$-Sr$_3$(PO$_4$)$_2$:Eu$^{2+}$, Sr$_5$(PO$_4$)$_3$F:Mn$^{2+}$, Sr$_5$(PO$_4$)$_3$F:Sb$^{3+}$, Sr$_5$(PO$_4$)$_3$F:Sb$^{3+}$,Mn$^{2+}$, Sr$_5$(PO$_4$)$_3$F:Sn$^{2+}$, Sr$_2$P$_2$O$_7$:Sn$^{2+}$, $\beta$-Sr$_3$(PO$_4$)$_2$:Sn$^{2+}$, $\beta$-Sr$_3$(PO$_4$)$_2$:Sn$^{2+}$,Mn$^{2+}$(Al), SrS:Ce$^{3+}$, SrS:Eu$^{2+}$, SrS:Mn$^{2+}$, SrS:Cu$^+$,Na, SrSO$_4$:Bi, SrSO$_4$:Ce$^{3+}$, SrSO$_4$:Eu$^{2+}$, SrSO$_4$:Eu$^{2+}$,Mn$^{2+}$, Sr$_6$Si$_4$O$_{10}$Cl$_6$:Eu$^{2+}$, Sr$_2$SiO$_4$:Eu$^{2+}$, SrTiO$_3$:Pr$^{3+}$, SrTiO$_3$:Pr$^{3+}$,Al$^{3+}$, Sr$_3$WO$_6$:U, SrY$_2$O$_3$:Eu$^{3+}$, ThO$_2$:Eu$^{3+}$, ThO$_2$:Pr$^{3+}$, ThO$_2$:Tb$^{3+}$, YAl$_3$B$_4$O$_{12}$:Bi$^{3+}$, YAl$_3$B$_4$O$_{12}$:Ce$^{3+}$, YAl$_3$B$_4$O$_{12}$:Ce$^{3+}$,Mn, YAl$_3$B$_4$O$_{12}$:Ce$^{3+}$,Tb$^{3+}$, YAl$_3$B$_4$O$_{12}$:Eu$^{3+}$, YAl$_3$B$_4$O$_{12}$:Eu$^{3+}$,Cr$^{3+}$, YAl$_3$B$_4$O$_{12}$:Th$^{4+}$,Ce$^{3+}$,Mn$^{2+}$, YAlO$_3$:Ce$^{3+}$, Y$_3$Al$_5$O$_{12}$:Ce$^{3+}$, Y$_3$Al$_5$O$_{12}$:Cr$^{3+}$, YAlO$_3$:Eu$^{3+}$, Y$_3$Al$_5$O$_{12}$:Eu$^{3r}$, Y$_4$Al$_2$O$_9$:Eu$^{3+}$, Y$_3$Al$_6$O$_{12}$:Mn$^{4+}$, YAlO$_3$:Sm$^{3+}$, YAlO$_3$:Tb$^{3+}$, Y$_3$Al$_5$O$_{12}$:Tb$^{3+}$, YAsO$_4$:Eu$^{3+}$, YBO$_3$:Ce$^{3+}$, YBO$_3$:Eu$^{3+}$, YF$_3$:Er$^{3+}$,Yb$^{3+}$, YF$_3$:Mn$^{2+}$, YF$_3$:Mn$^{2+}$,Th$^{4+}$, YF$_3$:Tm$^{3+}$,Yb$^{3+}$, (Y,Gd)BO$_3$:Eu, (Y,Gd)BO$_3$:Tb, (Y,Gd)$_2$O$_3$:Eu$^{3+}$,Y$_{1.34}$Gd$_{0.60}$O$_3$(Eu,Pr),Y$_2$O$_3$:Bi$^{3+}$, YOBrEu$^{3+}$,Y$_2$O$_3$:Ce,Y$_2$O$_3$:Er$^{3+}$,Y$_2$O$_3$:Eu$^{3+}$(YOE),Y$_2$O$_3$:Ce$^{3+}$,Tb$^{3+}$,YOCl:Ce$^{3+}$, YOCl:Eu$^{3+}$, YOF:Eu$^{3+}$, YOF:Tb$^{3+}$, Y$_2$O$_3$:Ho$^{3+}$, Y$_2$O$_2$S:Eu$^{3+}$, Y$_2$O$_2$S:Pr$^{3+}$, Y$_2$O$_2$S:Tb$^{3+}$, Y$_2$O$_3$:Tb$^{3+}$, YPO$_4$:Ce$^{3+}$, YPO$_4$:Ce$^{3+}$,Tb$^{3+}$, YPO$_4$:Eu$^{3+}$, YPO$_4$:Mn$^{2+}$, Th$^{4+}$, YPO$_4$:V$^{5+}$, Y(P,V)O$_4$:Eu, Y$_2$SiO$_5$:Ce$^{3+}$, YTaO$_4$, YTaO$_4$:Nb$^{5+}$, YVO$_4$:Dy$^{3+}$, YVO$_4$:Eu$^{3+}$, ZnAl$_2$O$_4$:Mn$^{2+}$, ZnB$_2$O$_4$:Mn$^{2+}$, ZnBa$_2$S$_3$:Mn$^{2+}$, (Zn,Be)$_2$SiO$_4$:Mn$^{2+}$, Zn$_{0.4}$Cd$_{0.6}$S:Ag, Zn$_{0.6}$Cd$_{0.4}$S:Ag, (Zn,Cd)S:Ag,Cl, (Zn,Cd)S:Cu, ZnF$_2$:Mn$^{2+}$, ZnGa$_2$O$_4$, ZnGa$_2$O$_4$:Mn$^{2+}$, ZnGa$_2$S$_4$:Mn$^{2+}$, Zn$_2$GeO$_4$:Mn$^{2+}$, (Zn,Mg)F$_2$:Mn$^{2+}$, ZnMg$_2$(PO$_4$)$_2$:Mn$^{2+}$, (Zn,Mg)$_3$(PO$_4$)$_2$:Mn$^{2+}$, ZnO:Al$^{3+}$, Ga$^{3+}$, ZnO:Bi$^{3+}$, ZnO:Ga$^{3+}$, ZnO:Ga, ZnO—CdO:Ga, ZnO:S, ZnO:Se, ZnO:Zn, ZnS:Ag$^+$,Cl$^-$, ZnS:Ag,Cu,Cl, ZnS:Ag,Ni, ZnS:Au,In, ZnS—CdS (25-75), ZnS—CdS (50-50), ZnS—CdS (75-25), ZnS—CdS:Ag,Br,Ni, ZnS—CdS:Ag$^+$,Cl, ZnS—CdS:Cu,Br, ZnS—CdS:Cu,I, ZnS:Cl$^-$, ZnS:Eu$^{2+}$, ZnS:Cu, ZnS:Cu$^+$,Al$^{3+}$, ZnS:Cu$^{30}$, Cl$^-$, ZnS:Cu,Sn, ZnS:Eu$^{2+}$, ZnS:Mn$^{2+}$, ZnS:Mn, Cu, ZnS:Mn$^{2+}$,Te$^{2+}$, ZnS:P, ZnS:Pb$^{2+}$,Cl$^-$, ZnS:Pb$^{2+}$, Cl$^-$, ZnS:Pb,Cu, Zn$_3$(PO$_4$)$_2$:Mn$^{2+}$, Zn$_2$SiO$_4$:Mn$^{2+}$, Zn$_2$SiO$_4$:Mn$^{2+}$,As$^{5+}$, Zn$_2$SiO$_4$:Mn,Sb$_2$O$_2$, Zn$_2$SiO$_4$:Mn$^{2+}$,P, Zn$_2$SiO$_4$:Ti$^{4+}$, ZnS:Sn$^{2+}$, ZnS:Sn,Ag, ZnS:Sn$^{2+}$,Li$^+$, ZnS:Te,Mn, ZnS—ZnTe:Mn$^{2+}$, ZnSe:Cu$^+$,Cl, ZnWO$_4$ The following examples are intended to illustrate the present invention. However, they should in no way be regarded as limiting. All compounds or components which can be used in the compositions are either known and commercially available or can be synthesised by known methods. The temperatures indicated in the examples are always given in ° C. It furthermore goes without saying that, both in the description and also in the examples, the added amounts of the components in the compositions always add up to a total of 100%. Percentage data given should always be regarded in the given connection. However, they usually always relate to the weight of the part-amount or total amount indicated.

EXAMPLES

Example 1

Preparation of $CaSiN_2$:Eu (2 at-%)

The reference phosphor is prepared in a glove box under a dry $N_2$ atmosphere (rel. atmospheric humidity <1%).
0.98 mol of $CaH_2$ (41.2364 g), 0.33 mol of $Si_3N_4$ (46.2934 g) and 0.02 mol of $EuF_3$ (4.179 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1a

Preparation of $CaSiN_2$:Eu (2 at-%) Co-Doped with 0.005 at-% of Mg

The preparation is carried out in a glove box under a dry $N_2$ atmosphere (rel. atmospheric humidity <1%).
0.979951 mol of $CaH_2$ (41.2341 g), 0.33 mol of $Si_3N_4$ (46.2934 g), 0.02 mol of $EuF_3$ (4.179 g) and 0.000049 mol of $MgF_2$ (0.0031 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1b

Preparation of $CaSiN_2$:Eu (2 at-%) Co-Doped with 0.005 at-% of Be

The preparation is carried out in a glove box under a dry $N_2$ atmosphere (rel. atmospheric humidity <1%).
0.979951 mol of $CaH_2$ (41.2341 g), 0.33 mol of $Si_3N_4$ (46.2934 g), 0.02 mol of $EuF_3$ (4.179 g) and 0.000049 mol of $BeF_2$ (0.0023 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1c

Preparation of $CaSiN_2$:Eu (2 at-%) Co-Doped with 0.005 at-% of Mn

The preparation is carried out in a glove box under a dry $N_2$ atmosphere (rel. atmospheric humidity <1%).
0.979951 mol of $CaH_2$ (41.2341 g), 0.33 mol of $Si_3N_4$ (46.2934 g), 0.02 mol of $EuF_3$ (4.179 g) and 0.000049 mol of $MnCl_2$ (0.0062 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1d

Preparation of $CaSiN_2$:Eu (2 at-%) Co-Doped with 0.005 at-% of Ni

The preparation is carried out in a glove box under a dry $N_2$ atmosphere (rel. atmospheric humidity <1%).
0.979951 mol of $CaH_2$ (41.2341 g), 0.33 mol of $Si_3N_4$ (46.2934 g), 0.02 mol of $EuF_3$ (4.179 g) and 0.000049 mol of $NiF_2$ (0.0047 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1e

Preparation of $CaSiN_2$:Eu (2 at-%) Co-Doped with 0.005 at-% of Co

The preparation is carried out in a glove box under a dry $N_2$ atmosphere (rel. atmospheric humidity <1%).
0.979951 mol of $CaH_2$ (41.2341 g), 0.33 mol of $Si_3N_4$ (46.2934 g), 0.02 mol of $EuF_3$ (4.179 g) and 0.000049 mol of $CoF_2$ (0.0047 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1f

Preparation of $CaSiN_2$:Eu (2 at-%) Co-Doped with 0.005 at-% of Ru

The preparation is carried out in a glove box under a dry $N_2$ atmosphere (rel. atmospheric humidity <1%).
0.979951 mol of $CaH_2$ (41.2341 g), 0.33 mol of $Si_3N_4$ (46.2934 g), 0.02 mol of $EuF_3$ (4.179 g) and 0.000049 mol of $RuF_2$ (0.0059 g) are weighed out in the glove box and homogenised in an agate mortar.
The mixture is introduced into an Mo crucible and transferred into a suitable transport vessel.
The crucible is transferred into a tubular furnace under a continuous stream of argon and heated at 1500° C. for 8 hours under forming gas 90/10 and $NH_3$.

Example 1c

Preparation of $CaSiN_2$:Eu (2 at-%) Co-Doped with 0.005 at-% of Hf

The preparation is carried out in a glove box under a dry $N_2$ atmosphere (rel. atmospheric humidity <1%).
0.98 mol of $CaH_2$ (41.2364 g), 0.32995 mol of $Si_3N_4$ (46.2863 g), 0.02 mol of $EuF_3$ (4.179 g) and 0.00005 mol of $HfF_4$ (0.0127 g) are weighed out in the glove box and homogenised in an agate mortar.

The mixture is introduced into an Mo crucible and transferred into a suitable transport vessel.

The crucible is transferred into a tubular furnace under a continuous stream of argon and heated at 1500° C. for 8 hours under forming gas 90/10 and $NH_3$.

Example 1h

Preparation of $CaSiN_2$:Eu (2 at-%) Co-doped with 0.005 at-% of Th

The preparation is carried out in a glove box under a dry $N_2$ atmosphere (rel. atmospheric humidity <1%).

0.98 mol of $CaH_2$ (41.2364 g), 0.32995 mol of $Si_3N_4$ (46.2863 g), 0.02 mol of $EuF_3$ (4.179 g) and 0.00005 mol of $ThF_4$ (0.0154 g) are weighed out in the glove box and homogenised in an agate mortar.

The mixture is introduced into an Mo crucible and transferred into a suitable transport vessel.

The crucible is transferred into a tubular furnace under a continuous stream of argon and heated at 1500° C. for 8 hours under forming gas 90/10 and $NH_3$.

Example 1i

Preparation of $CaSiN_2$:Eu (2 at-%) Co-Doped with 0.005 at-% of Zr

The preparation is carried out in a glove box under a dry $N_2$ atmosphere (rel. atmospheric humidity <1%).

0.98 mol of $CaH_2$ (41.2364 g), 0.32995 mol of $Si_3N_4$ (46.2863 g), 0.02 mol of $EuF_3$ (4.179 g) and 0.00005 mol of $ZrF_4$ (0.0084 g) are weighed out in the glove box and homogenised in an agate mortar.

The mixture is introduced into an Mo crucible and transferred into a suitable transport vessel.

The crucible is transferred into a tubular furnace under a continuous stream of argon and heated at 1500° C. for 8 hours under forming gas 90/10 and $NH_3$.

DESCRIPTION OF THE FIGURES

The invention will be explained in greater detail below with reference to a number of working examples. The figures show the following.

Figure 1:
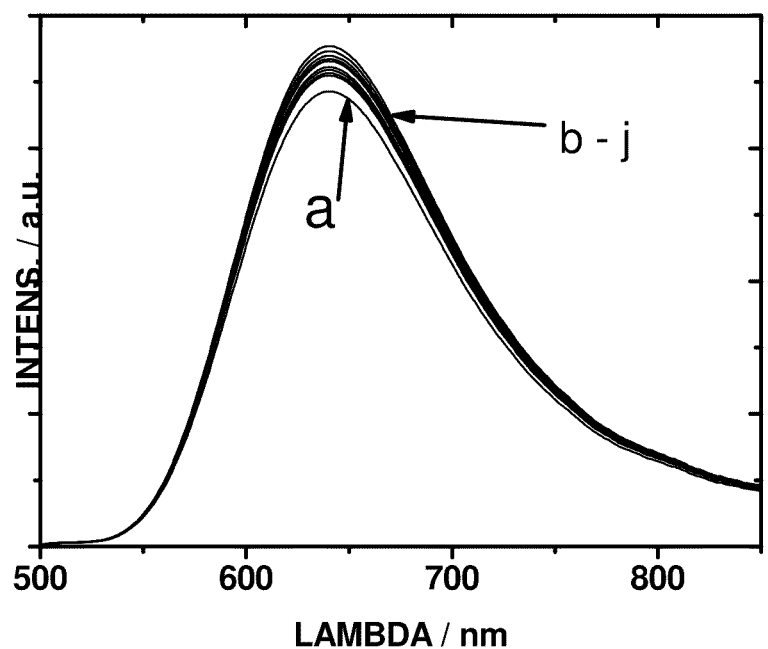
FIG. 1: shows the emission spectrum of $Ca_{0.98}SiN_2$:$EU_{0.02}$ and co-doped phosphor with 450 nm excitation
a) pure $Ca_{0.98}SiN_2$:$EU_{0.02}$
b)-j) $Ca_{0.98}SiN_2$:$EU_{0.02}$ with co-dopants (each 0.005 at-%):
b=Mg, c=Be, d=Mn, e=Ni, f=Co, g=Zr, h=Ru, i=Hf, j=Th
Figure 2:
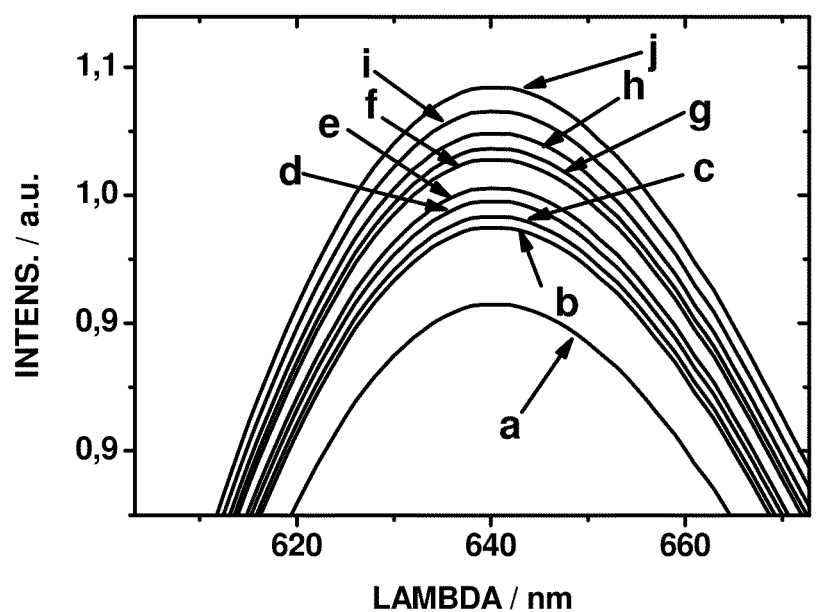
FIG. 2: shows a detail enlargement from FIG. 1 for better differentiation of emission spectra a to j.
Figure 3:
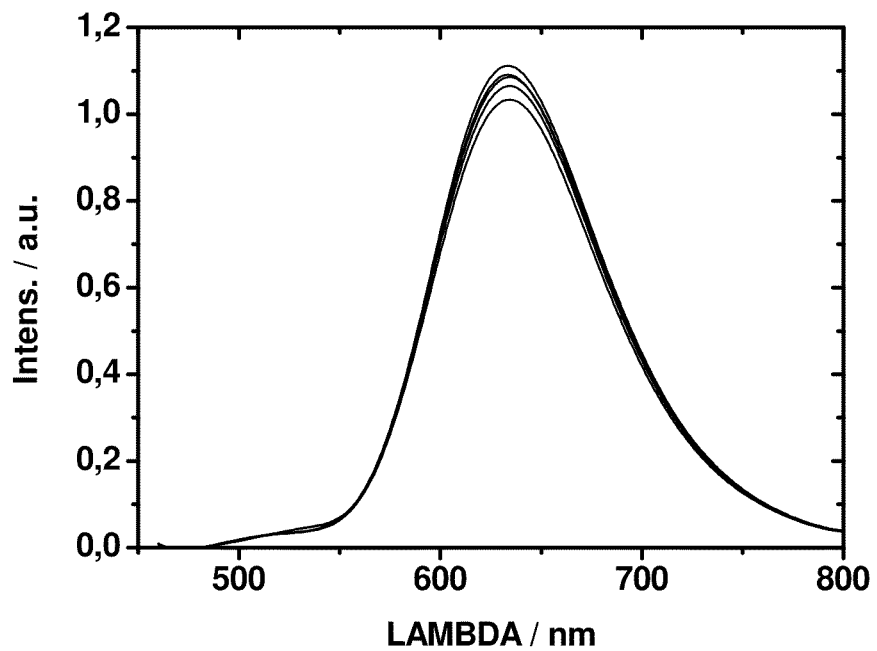
FIG. 3: shows the emission spectrum of $Sr_{0.98}SiN_2$:$Eu_{0.02}$ and co-doped phosphor at an excitation wavelength of 450 nm.
Figure 4:
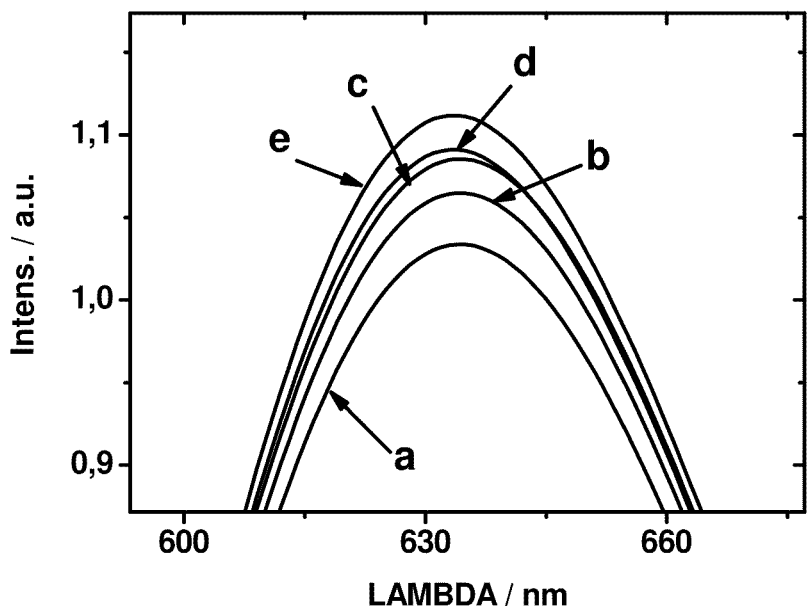
FIG. 4: shows a detail enlargement from FIG. 3 for better differentiation of the emission spectra. a) denotes pure $Sr_{0.98}SiN_2$:$Eu_{0.02}$, b) denotes $Sr_{0.98}SiN_2$:$Eu_{0.02}$ co-doped with 0.005 at-% of Mg or Be; c) denotes $Sr_{0.98}SiN_2$:$Eu_{0.02}$ co-doped with 0.005 at-% of Ni or Co; d) denotes $Sr_{0.98}SiN_2$:$Eu_{0.02}$ co-doped with 0.005 at-% of Ru or Mn or Zr; e) denotes $Sr_{0.98}SiN_2$:$Eu_{0.02}$ co-doped with 0.005 at-% of Hf or Th.
Figure 5:
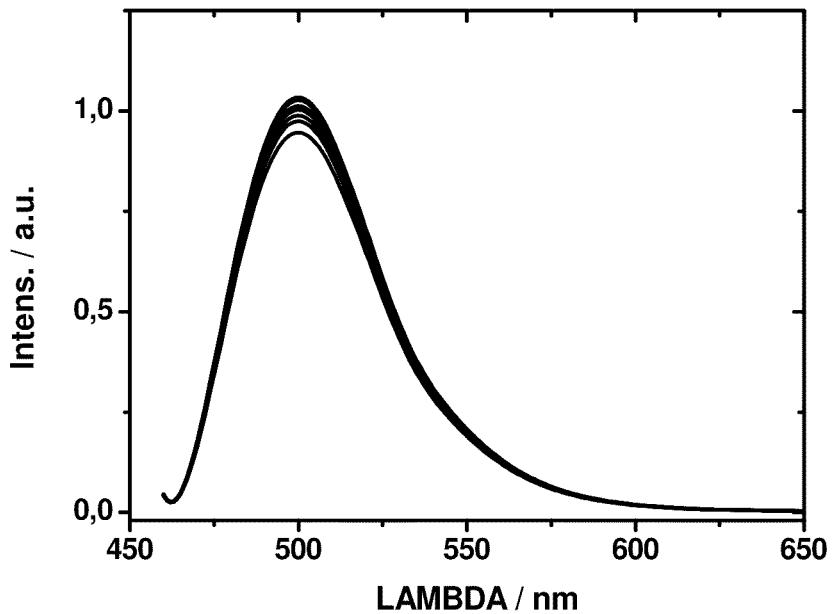
FIG. 5: shows the emission spectrum of $Ba_{0.98}SiN_2$:$Eu_{0.02}$ and co-doped phosphor at an excitation wavelength of 450 nm.
Figure 6:
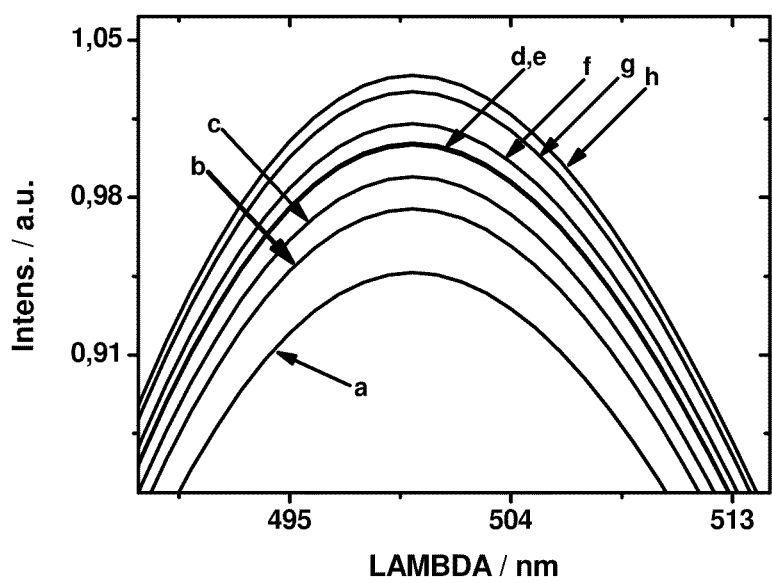
FIG. 6: shows a detail enlargement from FIG. 5 for better differentiation of the emission spectra. a) denotes pure $Ba_{0.98}SiN_2$:$Eu_{0.02}$; b) denotes $Ba_{0.98}SiN_2$:$Eu_{0.02}$ co-doped with 0.005 at-% of Mg; c) denotes $Ba_{0.98}SiN_2$:$Eu_{0.02}$ co-doped with 0.005 at-% of Be; d) denotes $Ba_{0.98}SiN_2$:$Eu_{0.02}$ co-doped with 0.005 at-% of Mn; e) denotes $Ba_{0.98}SiN_2$:$Eu_{0.02}$ co-doped with 0.005 at-% of Ni or Co; f) denotes $Ba_{0.98}SiN_2$:$Eu_{0.02}$ co-doped with 0.005 at-% of Zr; g) denotes $Ba_{0.98}SiN_2$:$Eu_{0.02}$ co-doped with 0.005 at-% of Ru or Hf; h) denotes $Ba_{0.98}SiN_2$:$Eu_{0.02}$ co-doped with 0.005 at-% of Zr or Th.
Figure 7:
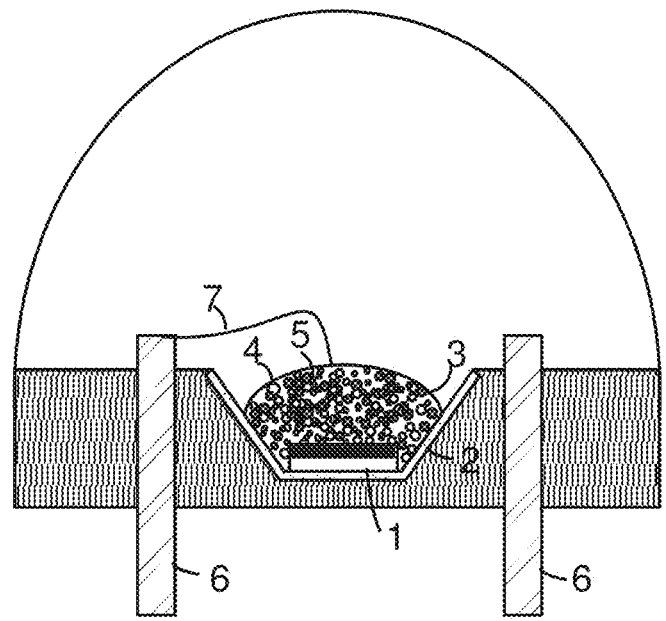
FIG. 7: shows a diagrammatic depiction of a light-emitting diode having a phosphor-containing coating. The component comprises a chip-like LED 1 as radiation source. The LED is mounted a a cup-shaped reflector, which is held by an adjustment frame 2. The chip 1 is connected to a first contact 6 via a flat cable 7 and directly to a second electrical contact 6'. A coating which comprises a conversion phosphor according to the invention has been applied to the inside curvature of the reflector cup. The phosphors are employed either separately from one another or as a mixture. (List of part numbers: 1 light-emitting diode, 2 reflector, 3 resin, 4 conversion phosphor, 5 diffuser, 6 electrodes, 7 flat cable)
Figure 8:
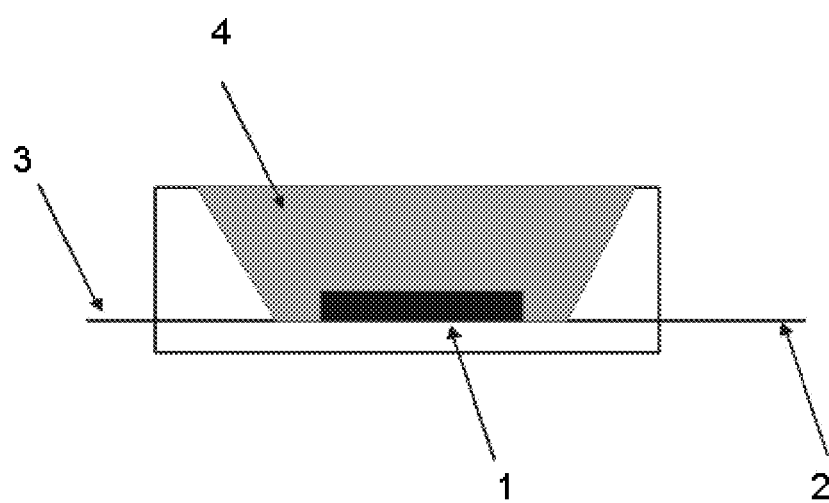
FIG. 8: shows a Golden Dragon package, which serves as light source (LED) for white light (1=semiconductor chip; 2,3=electrical connections; 4=conversion phosphor in cavity with reflector). The conversion phosphor is dispersed in a binder, where the mixture fills the cavity.
Figure 9:
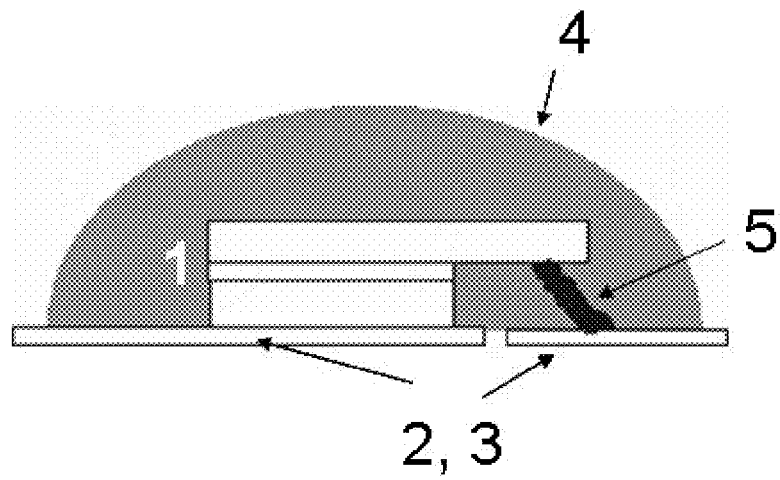
FIG. 9: shows a diagrammatic depiction of a light-emitting diode where 1=semiconductor chip; 2,3=electrical connections; 4=conversion phosphor, 5=bond wire, where the phosphor is applied in a binder as top globe. This form of the phosphor/binder layer can act as secondary optical element and influence, for example, light propagation.
Figure 10:
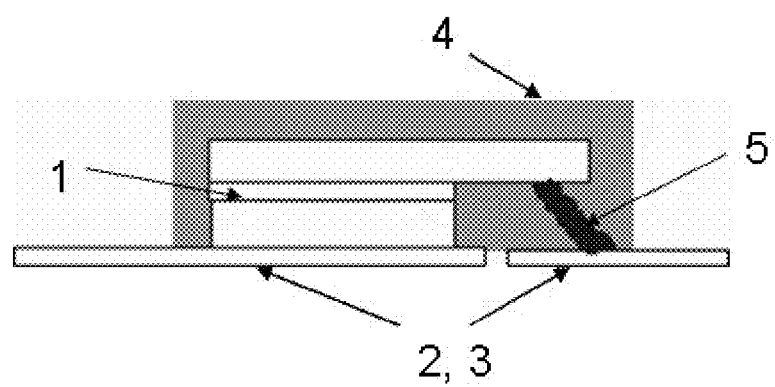
FIG. 10: shows a diagrammatic depiction of a light-emitting diode where 1=semiconductor chip; 2,3=electrical connections; 4=conversion phosphor; 5=bond wire, where the phosphor is applied as a thin layer dispersed in a binder. A further component acting as secondary optical element, such as, for example, a lens, can easily be applied to this layer.
Figure 11:
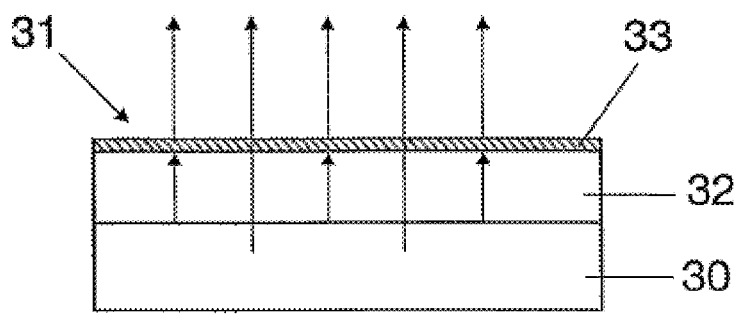
FIG. 11: shows an example of a further application, as is already known in principle from U.S. Pat. No. 6,700,322. The phosphor according to the invention is used here together with an OLED. The light source is an organically light-emitting diode 31, consisting of the actual organic film 30 and a transparent substrate 32. The film 30 emits, in particular, blue primary light, generated, for example, by means of PVK: PBD:coumarine (PVK, abbreviation for poly(n-vinylcarbazole); PBD, abbreviation for 2-(4-biphenyl)-5-(4-tert-butylphenyl)-1,3,4-oxadiazole)). The emission is partially converted into yellow, secondarily emitted light by a cover layer formed from a layer 33 of the phosphor according to the invention, so that white emission is achieved overall through colour mixing of the primarily and secondarily emitted light.

The OLED essentially consists of at least one layer of a light-emitting polymer or of so-called small molecules between two electrodes, which consist of materials known per se, such as, for example, ITO (abbreviation for indium tin oxide), as anode and a highly reactive metal, such as, for example, Ba or Ca, as cathode. A plurality of layers is also often used between the electrodes, which either serve as hole-transport layer or, in the area of small molecules, also as electron-transport layers. The emitting polymers used are, for example, polyfluorenes or polyspiro materials.

The invention claimed is:
1. A 1-1-2 alkaline-earth metal siliconitride compound with europium doping which additionally comprises one or more co-dopants from the series Ni, Co, Ru, and Th.

2. A compound according to claim 1, wherein said compound is of formula I

$$(Ca,Sr,Ba)_{1-x-y}Me_ySiN_2:Eu_x \quad (I)$$

where
Me=$Ni^{2+}$, $Co^{2+}$ and/or $Ru^{2+}$,
X=0.005 to 0.20, and
y<1.

3. A compound according to claim 1, wherein said compound is of formula II

$$(Ca,Sr,Ba)_{1-x}Si_{1-z}Ma_zN_2:Eu_x \quad (II)$$

where
Ma=$Th^{4+}$
x=0.005 to 0.20, and
z<1.

4. A compound according to claim 2, wherein y=0.0005 to 0.2.

5. A compound according to claim 2, wherein x=0.05 to 0.15 and/or y=0.001 to 0.02.

6. A compound according to claim 1, obtainable by mixing silicon nitride-, europium- and calcium- and/or strontium- and/or barium-containing starting materials with at least one nickel-, cobalt-, ruthenium-, and/or thorium-containing co-dopant by solid-state diffusion methods and subsequent thermal aftertreatment.

7. A process for the preparation of a compound according to claim 1, said process comprising:
 a) preparing an europium-doped 1-1-2 alkaline-earth metal siliconitride compound which is co-doped with nickel-, cobalt-, ruthenium-, and/or thorium-containing materials, by mixing at least 4 starting materials selected from silicon nitride-, europium-, calcium, strontium-, barium-, nickel-, cobalt-, ruthenium-, and/or thorium-containing materials, and
 b) subjecting the resultant co-doped compound to thermal aftertreatment.

8. A shaped body comprising a compound according to claim 1, wherein said shaped has a rough surface which carries nanoparticles comprising $SiO_2$, $TiO_2$, $Al_2O_3$, ZnO, $ZrO_2$ and/or $Y_2O_3$ or mixed oxides thereof and/or particles comprising the compound according to claim 1.

9. A shaped body comprising a compound according to claim 1, wherein said shaped body has a continuous surface coating which consists of $SiO_2$, $TiO_2$, $Al_2O_3$, ZnO, $ZrO_2$ and/or $Y_2O_3$ or mixed oxides thereof and/or consists of a compound of formula I without the activator europium.

10. A shaped body comprising a compound according to claim 1, wherein said shaped body has a porous surface coating which consists of $SiO_2$, $TiO_2$, $Al_2O_3$, ZnO, $ZrO_2$ and/or $Y_2O_3$ or mixed oxides thereof and/or of the compound according to claim 1.

11. A shaped body comprising a compound according to claim 1, wherein the surface of said shaped body carries functional groups which facilitate chemical or physical bonding to the environment.

12. A process for the production of a shaped body having, said process comprising:
 a) preparing a 1-1-2 europium-doped alkaline-earth metal siliconitride compound which is co-doped with nickel-, cobalt-, ruthenium-, and/or thorium-containing materials, by mixing at least 4 starting materials selected from silicon nitride-, europium-, calcium, strontium-, barium-, nickel-, cobalt-, ruthenium-, and/or thorium-containing materials,
 b) subjecting the resultant co-doped compound to thermal aftertreatment and forming a shaped body having a rough from the resultant co-doped compound, and
 c) coating the rough surface with nanoparticles comprising $SiO_2$, $TiO_2$, $Al_2O_3$, ZnO, $ZrO_2$ and/or $Y_2O_3$ or mixed oxides thereof or with nanoparticles comprising the compound according to claim 1 or a compound of formula I without dopants.

13. An illumination unit having at least one primary light source whose emission maximum is in the range of 410 nm to 530 nm, where this radiation is partially or completely converted into longer-wavelength radiation by a compound according to claim 1.

14. An illumination unit according to claim 13, wherein said primary light source is a luminescent indium aluminum gallium nitride.

15. An illumination unit according to claim 13, wherein said primary light source is a luminescent compound based on ZnO, TCO (transparent conducting oxide), ZnSe or SiC.

16. An illumination unit according to claim 13, wherein said primary light source is a material based on an organic light-emitting layer.

17. An illumination unit according to claim 13, wherein said primary light source is a plasma or discharge lamp.

18. An illumination unit according to claim 13, wherein said compound is arranged directly on the primary light source and/or remote therefrom.

19. An illumination unit according to claim 13, wherein the optical coupling between said compound and the primary light source is achieved by means of a light-conducting arrangement.

20. A method for partial or complete conversion of the blue or near-UV emission from a luminescent diode comprising employing at least one compound of claim 1 as a conversion phosphor.

21. A method of converting primary radiation into a certain color point in accordance with the color-on-demand concept, said method comprising converting said primary radiation by using at least one compound according to claim 1 as conversion phosphor.

22. A method comprising using a shaped body according to claim 8 as phosphor element.

23. A compound according to claim 3, wherein x=0.05 to 0.15 and/or z=0.001 to 0.02.

24. A shaped body according to claim 11, wherein said functional groups consist of epoxy or silicone resin.

25. An illumination according to claim 13, wherein the emission maximum of said primary light source is in the range of 430 nm and 500 nm.

26. An illumination unit according to claim 14, wherein said luminescent indium aluminum gallium nitride is of the formula $In_iGa_jAl_kN$, where $0 \le i$, $0 \le j$, $0 \le k$, and $i+j+k=1$.

27. An illumination unit having at least one primary light source whose emission maximum is in the range of 410 nm to 530 nm where this radiation is partially or completely converted into longer-wavelength radiation by a shaped body according to claim 8.

28. A compound according to claim 1, wherein said compound is $CaSiN_2$:Eu co-doped with Ni, $CaSiN_2$:Eu co-doped with Co, $CaSiN_2$:Eu co-doped with Ru, or $CaSiN_2$:Eu (2 at-%) co-doped with Th.

29. A compound according to claim 1, wherein said compound is an alkaline-earth metal siliconitride compound with europium doping which additionally comprises one or more co-dopants from the series Ni, Co, and Ru.

30. A compound according to claim 3, wherein $z=0.0005$ to $0.2$.

* * * * *